(12) United States Patent
Hirakata et al.

(10) Patent No.: US 10,481,312 B2
(45) Date of Patent: Nov. 19, 2019

(54) LAMINATE AND IMAGE DISPLAY DEVICE

(71) Applicant: FUJIFILM Corporation, Tokyo (JP)

(72) Inventors: Junichi Hirakata, Kanagawa (JP);
Yuya Hamaguchi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 185 days.

(21) Appl. No.: 15/652,846

(22) Filed: Jul. 18, 2017

(65) Prior Publication Data

US 2017/0315282 A1    Nov. 2, 2017

Related U.S. Application Data

(63) Continuation of application No. PCT/JP2016/053092, filed on Feb. 2, 2016.

(30) Foreign Application Priority Data

Feb. 4, 2015    (JP) .................................. 2015-020749

(51) Int. Cl.
*G02B 5/30* (2006.01)
*B32B 9/04* (2006.01)
(Continued)

(52) U.S. Cl.
CPC ................ *G02B 5/305* (2013.01); *B32B 9/04* (2013.01); *G02F 1/1339* (2013.01);
(Continued)

(58) Field of Classification Search
CPC ........... G02B 5/305; B32B 7/02; B32B 23/04; B32B 27/281; B32B 27/308; G02F 1/1335; G02F 1/133528; G02F 9/30; G02F 9/301; Y10T 428/10; Y10T 428/1005; Y10T 428/1009; Y10T 428/1045
(Continued)

(56) References Cited

U.S. PATENT DOCUMENTS

| 8,531,765 B2 | 9/2013 | Sakai et al. |
| 2003/0011740 A1* | 1/2003 | Tanaka ............... G02F 1/133734 349/177 |

(Continued)

FOREIGN PATENT DOCUMENTS

| JP | H02-022625 A | 1/1990 |
| JP | 2002-156524 A | 5/2002 |

(Continued)

OTHER PUBLICATIONS

Notification of Reasons for Refusal issued by the Japanese Patent Office dated Nov. 6, 2018, in connection with Japanese Patent Application No. 2016-573385.
(Continued)

*Primary Examiner* — Ruiyun Zhang
(74) *Attorney, Agent, or Firm* — Edwards Neils LLC; Jean C. Edwards, Esq.

(57) ABSTRACT

An object of the invention is to provide a novel laminate and a novel image display device which have both of a gas barrier function and a polarizer function and have a reduced thickness as compared to those in the related art. A laminate of the invention has a laminate which has a substrate, an inorganic layer, and an organic layer, and the organic layer contains an organic dichroic pigment.

5 Claims, 1 Drawing Sheet

(51) Int. Cl.
  *G02F 1/1335* (2006.01)
  *G02F 1/1339* (2006.01)
  *H01L 51/52* (2006.01)

(52) U.S. Cl.
  CPC .... *G02F 1/133528* (2013.01); *H01L 51/5253* (2013.01); *H01L 51/5281* (2013.01); *B32B 2457/202* (2013.01); *G02F 2202/043* (2013.01); *Y10T 428/10* (2015.01); *Y10T 428/1009* (2015.01); *Y10T 428/1036* (2015.01)

(58) Field of Classification Search
  USPC .... 428/1.1, 1.2, 1.21, 1.3; 349/96, 123, 138, 349/94; 257/40, 88
  See application file for complete search history.

(56) References Cited

U.S. PATENT DOCUMENTS

| | | | |
|---|---|---|---|
| 2011/0052892 A1 | 3/2011 | Murakami | |
| 2011/0222155 A1 | 9/2011 | Sakai et al. | |
| 2011/0279883 A1* | 11/2011 | Kumar | C09B 57/00 359/241 |
| 2013/0107195 A1* | 5/2013 | Morishima | C09K 19/601 349/194 |
| 2016/0047963 A1 | 2/2016 | Kagawa et al. | |
| 2017/0187004 A1* | 6/2017 | Giraldo | H01L 51/5253 |

FOREIGN PATENT DOCUMENTS

| | | | |
|---|---|---|---|
| JP | 2007-148097 A | | 6/2007 |
| JP | 2007-156234 A | | 6/2007 |
| JP | 2009-251288 A | | 10/2009 |
| JP | 2009251288 A | * | 10/2009 |
| JP | 2011-051220 A | | 3/2011 |
| JP | 2011-209390 A | | 10/2011 |
| JP | 2011-237513 A | | 11/2011 |
| JP | 2012-032418 A | | 2/2012 |
| WO | 2014/189040 A1 | | 11/2014 |

OTHER PUBLICATIONS

International Preliminary Report on Patentability issued by WIPO dated Aug. 17, 2017, in connection with International Patent Application No. PCT/JP2016/053092.

Notification of Reasons for Refusal issued by the Japanese Patent Office dated May 8, 2018, in connection with Japanese Application No. 2016-573385.

International Search Report issued in PCT/JP2016/053092 dated Mar. 15, 2016.

Written Opinion issued in PCT/JP2016/053092 dated Mar. 15, 2016.

Notification of Reasons for Refusal issued by the Japanese Patent Office dated Apr. 9, 2019, in connection with Japanese Patent Application No. 2016-573385.

* cited by examiner

LAMINATE AND IMAGE DISPLAY DEVICE

CROSS-REFERENCE TO RELATED APPLICATIONS

This application is a Continuation of PCT International Application No. PCT/JP2016/053092 filed on Feb. 2, 2016, which was published under PCT Article 21(2) in Japanese, and which claims priority under 35 U.S.C. § 119(a) to Japanese Patent Application No. 2015-020749 filed on Feb. 4, 2015. The above applications are hereby expressly incorporated by reference, in their entirety, into the present application.

BACKGROUND OF THE INVENTION

1. Field of the Invention

The present invention relates to a laminate and an image display device.

2. Description of the Related Art

Various types of plastics have been examined as a substitute for glass substrates of devices such as liquid crystal display elements and organic electroluminescence (EL) display elements.

Here, plastic is poorer in gas barrier property for shielding oxygen and water vapor than glass. Accordingly, in a case where plastic is used as a substitute for a glass substrate, a gas barrier film for sealing may be used in combination.

As such a gas barrier film, a gas barrier film having a base film, an organic layer, and an inorganic layer is considered (for example, JP2011-51220A).

A polarizer may be used in order to add a function to an image display device.

This polarizer is used in principle in a liquid crystal display element, but in an organic EL display element, may be used to suppress the reflection of outdoor daylight in the image display device. Specifically, technologies for suppressing the reflection of outdoor daylight using a circular polarizing plate having a polarization conversion function have been proposed for the purpose of preventing internal reflection of outdoor daylight (for example, JP2012-32418A).

SUMMARY OF THE INVENTION

Image display devices have been required to have a further reduced thickness since the use of image display devices in smartphones and the like is expanded.

An object of the invention is to provide a novel laminate and a novel image display device which have both of a gas barrier function and a polarizer function and have a reduced thickness as compared to those in the related art.

The inventors have focused on an organic layer of a usual gas barrier film having a laminate of an organic layer and an inorganic layer.

Here, in the gas barrier film having a laminate of an organic layer and an inorganic layer, the gas barrier property for shielding oxygen and water vapor is almost achieved by the inorganic layer, and the organic layer rarely contributes to the gas barrier property and functions as a spacer.

That is, the inventors have thought that the entire thicknesses of a laminate and an image display device can be reduced by adding a function to the organic layer.

A polarizer using an organic layer containing an organic dichroic pigment is exemplified as a polarizer which is used in an image display device. As the organic layer containing an organic dichroic pigment, a layer obtained by curing a composition containing an organic dichroic pigment is used as in a case of an organic layer for use in a gas barrier film.

The inventors have found that in a case where an organic layer in a gas barrier film is produced using an organic layer containing an organic dichroic pigment, the polarizer function can be integrated into the gas barrier film and the entire thicknesses of a laminate and an image display device can be reduced.

That is, the inventors have found that the above-described object can be achieved by the following configurations.

[1] A laminate comprising: a laminate which has a substrate, an inorganic layer, and an organic layer, in which the organic layer contains an organic dichroic pigment.

[2] The laminate according to [1], in which the inorganic layer contains at least one inorganic compound selected from the group consisting of silicon nitride, silicon oxide, silicon oxynitride, and aluminum oxide.

[3] The laminate according to [1] or [2], in which the organic dichroic pigment is a thermotropic liquid crystal dichroic pigment.

[4] The laminate according to any one of [1] to [3], in which the organic layer is a polarizer.

[5] The laminate according to any one of [1] to [3], in which the substrate, the inorganic layer, and the organic layer are provided in this order, and the inorganic layer has alignment controllability for the organic dichroic pigment, and no alignment film is provided between the inorganic layer and the organic layer.

[6] The laminate according to any one of [1] to [5], in which the inorganic layer is a layer produced by obliquely vapor-depositing an inorganic compound.

[7] The laminate according to any one of [1] to [3], in which the substrate, the organic layer, and the inorganic layer are provided in this order.

[8] An image display device comprising, in the following order from a visible side: a sealing material; and an image display element, in which the sealing material is the laminate according to any one of [1] to [7].

[9] The image display device according to [8], in which the sealing material is a laminate in which the substrate is disposed on the visible side.

[10] The image display device according to [8], in which the sealing material is a laminate in which the substrate is disposed on the image display element side.

[11] The image display device according to any one of [8] to [10], in which the image display element is an EL display element.

[12] The image display device according to [11], in which the EL display element is an organic EL display element.

[13] The image display device according to any one of [8] to [10], in which the image display element is a liquid crystal display element.

According to the invention, it is possible to provide a novel laminate and a novel image display device which have a gas barrier function and a polarizer function and have a reduced thickness as compared to those in the related art.

DESCRIPTION OF THE PREFERRED EMBODIMENTS

Figure 1:
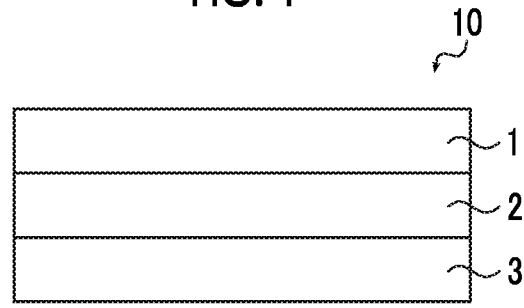
FIG. 1 is a schematic cross-sectional view illustrating an exemplary embodiment of a laminate of the invention.

Hereinafter, the invention will be described in detail.

Although the following description regarding the configuration requirements is based on representative embodiments of the invention, the invention is not limited to the embodiments.

In this specification, the numerical value ranges represented using "to" mean ranges including numerical values before and after "to" as a lower limit value and an upper limit value.

In this specification, the term "polarizing plate" means a plate in which a polarizing plate protective layer or a functional layer is disposed on at least one surface of a polarizer, and is used distinctively from a polarizer.

In this specification, the terms "parallel" and "perpendicular" encompass not only being parallel and perpendicular in the strict sense but also a range of ±5° from being parallel or perpendicular, respectively.

In this specification, the term "λ/4 plate" means a retardation plate in which an in-plane retardation is approximately ¼ of the wavelength. Specifically, a λ/4 plate is a retardation plate in which an in-plane retardation Re (550) at a wavelength of 550 nm is 110 nm to 160 nm.

The term "λ/2 plate" means a retardation plate in which an in-plane retardation is approximately ½ of the wavelength. Specifically, a λ/2 plate is a retardation plate in which an in-plane retardation Re (550) at a wavelength of 550 nm is 220 nm to 320 nm.

In this specification, the expression "has substantially no in-plane retardation" does not mean that the in-plane retardation is 0, but means that the in-plane retardation is almost 0. Specifically, the above expression means that an in-plane retardation Re (550) at a wavelength of 550 nm is 10 nm or less.

Specifically, the expression "has an in-plane retardation" means that an in-plane retardation Re (550) at a wavelength of 550 nm is greater than 10 nm.

In this specification, the term "C-plate" means a retardation plate in which an in-plane retardation Re (550) is 10 nm or less and which has a thickness-direction retardation. A C-plate having a negative retardation in a thickness direction is a "positive C-plate", and a C-plate having a positive retardation in a thickness direction is a "negative C-plate".

In this specification, Re (λ) and Rth (λ) represent an in-plane retardation and a thickness-direction retardation at a wavelength λ, respectively, Re (λ) is measured by making light with a wavelength of λ nm enter a film in a normal direction of the film in KOBRA 21ADH or KOBRA WR (all manufactured by Oji Scientific Instruments). A measurement wavelength λ nm can be selected by manually replacing a wavelength selective filter, or the measured value can be converted by using a program or the like for measurement.

Here, in a case where the film to be measured is one represented by a uniaxial or biaxial index ellipsoid, Rth (λ) is calculated by the following method.

Rth (λ) is calculated as follows: Re (λ) is measured at six points in total by making light with a wavelength of λ nm enter in directions inclined at intervals of 10 degrees up to 50 degrees on one side with respect to the normal direction of the film, as a slow axis (judged by KOBRA 21ADH or KOBRA WR) in the plane serves as an inclined axis (rotational axis) (in a case where there is no slow axis, an arbitrary direction in the film plane serves as a rotational axis); and then Rth (λ) is calculated by KOBRA 21ADH or KOBRA WR, based on the retardation values measured, an assumed value of the average refractive index, and a film thickness value that has been input.

In the above description, in a case of a film in which a slow axis in the plane from the normal direction serves as a rotational axis and there is a direction in which the retardation value is zero at a certain inclined angle, a minus sign is imparted to the retardation value at an inclined angle greater than the certain inclined angle, and then the calculation is carried out by KOBRA 21ADH or KOBRA WR.

Additionally, with a slow axis serving as an inclined axis (rotational axis) (in a case where there is no slow axis, an arbitrary direction in the film plane serves as a rotational axis), the retardation values may be measured in relation to two arbitrary inclined directions, and then Rth (λ) may be calculated from the following Formulae (1) and (2) based on the retardation values, an assumed value of the average refractive index, and a film thickness value that has been input.

$$Re(\theta) = \left[ nx - \frac{ny \times nz}{\sqrt{\left\{ ny \sin\left(\sin^{-1}\left(\frac{\sin(-\theta)}{nx}\right)\right)\right\}^2 + \left\{ nz \cos\left(\sin^{-1}\left(\frac{\sin(-\theta)}{nx}\right)\right)\right\}^2}} \right] \times \frac{d}{\cos\left\{\sin^{-1}\left(\frac{\sin(-\theta)}{nx}\right)\right\}} \quad \text{Formula (1)}$$

$$Rth\left[\frac{nx+ny}{2} - nz\right] = \times d \quad \text{Formula (2)}$$

In the formulae, Re (θ) denotes a retardation value in a direction inclined at an angle of θ from the normal direction. nx denotes a refractive index in the slow axis direction in the plane, ny denotes a refractive index in a direction perpendicular to nx in the plane, and nz denotes a refractive index in a direction perpendicular to nx and ny. d denotes a film thickness.

In a case where the film to be measured cannot be represented by a uniaxial or biaxial index ellipsoid, in other words, has no optic axis, Rth (λ) is calculated by the following method.

Rth (λ) is calculated as follows: Re (λ) is measured at eleven points by making light with a wavelength of λ nm enter in directions inclined at intervals of 10 degrees from −50 degrees to +50 degrees with respect to the normal direction of the film, as a slow axis (judged by KOBRA 21ADH or KOBRA WR) in the plane serves as an inclined axis rotational axis); and then Rth (λ) is calculated by KOBRA 21ADH or KOBRA WR, based on the retardation values measured, an assumed value of the average refractive index, and a film thickness value that has been input.

In the above description, as the assumed value of the average refractive index, values mentioned in Polymer Handbook (JOHN WILEY & SONS, INC) or in the catalogues of various optical films can be used. Regarding an optical film of which the value of the average refractive index is unknown, the value can be measured using an Abbe refractometer. The values of the average refractive indices of major optical films are shown below as examples: cellulose acylate (1.48), cycloolefin polymer (1.52), polycarbonate (1.59), polymethyl methacrylate (1.49), and polystyrene (1.59). By inputting the assumed value of the average refractive index and the film thickness, KOBRA 21ADH or KOBRA WR calculates nx, ny and nz. Based on nx, ny and nz that have been calculated, Nz=(nx−nz)/(nx−ny) is calculated, <Laminate>

A laminate of the invention is a laminate which has a laminate having a substrate, an inorganic layer, and an organic layer, and in which the organic layer contains an organic dichroic pigment.

Hereinafter, exemplary embodiments of the laminate of the invention will be described using FIGS. 1, 2A, and 2B.

A laminate 10 illustrated in FIG. 1 has a substrate 1, an inorganic layer 2, and an organic layer 3. The organic layer 3 contains an organic dichroic pigment.

The laminate of the invention has both of a gas barrier function and a polarizer function by imparting a function of an organic layer containing an organic dichroic pigment to an organic layer in a barrier film which is usually used and has a laminate of an inorganic layer and an organic layer.

Figure 2A:
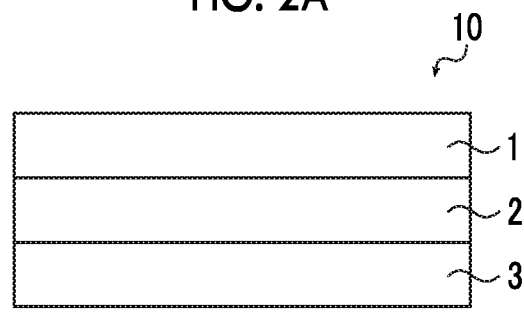
FIG. 2A is a schematic cross-sectional view illustrating an exemplary embodiment of the laminate of the invention.

In an embodiment of the laminate of the invention, as illustrated in FIG. 2A, a substrate 1, an inorganic layer 2, and an organic layer 3 are provided in this order, and a separate alignment film is not provided between the inorganic layer 2 and the organic layer 3. Hereinafter, in this specification, this embodiment may be referred to as Embodiment 2-A.

Figure 2B:
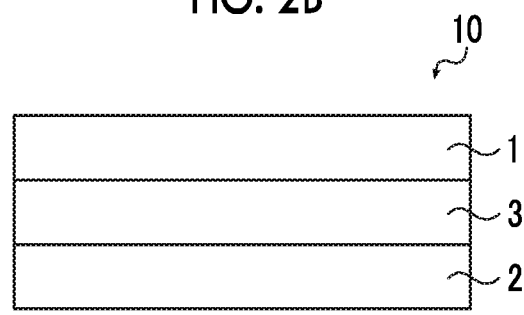
FIG. 2B is a schematic cross-sectional view illustrating an exemplary embodiment of the laminate of the invention.

In another embodiment of the laminate of the invention, as illustrated in FIG. 2B, a substrate 1, an organic layer 3, and an inorganic layer 2 are provided in this order. Hereinafter, in this specification, this embodiment may be referred to as Embodiment 2-B.

The laminate of the invention has both of a gas barrier function and a polarizer function. Accordingly, the laminate is reduced in thickness as compared to those in the related art by a thickness of the polarizer or the gas barrier film.

<Image Display Device>

An image display device of the invention is an image display device which has a sealing material and an image display element in this order from the visible side, and uses the laminate of the invention as the sealing material.

In the invention, the sealing material may be any one of a laminate in which the substrate is disposed on the visible side and a laminate in which the substrate is disposed on the image display element side. However, since the influence of the retardation of the substrate can be reduced, a laminate in which the substrate is disposed on the visible side, that is, a laminate having a substrate, an inorganic layer, and an organic layer in this order from the visible side, or a laminate having a substrate, an organic layer, and an inorganic layer in this order from the visible side is preferable.

Hereinafter, exemplary embodiments of the image display device of the invention will be described using FIG. 3.

Figure 3:
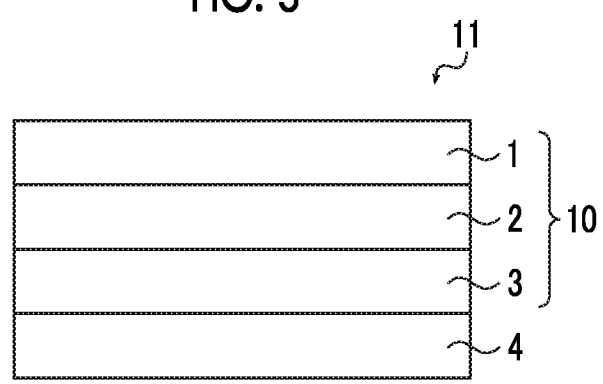
FIG. 3 is a schematic cross-sectional view illustrating an exemplary embodiment of an image display device of the invention.

An image display device 11 illustrated in FIG. 3 includes a laminate 10 of the invention having a substrate 1, an inorganic layer 2, and an organic layer 3, and has an image display element 7 which is provided on a side of the laminate 10 opposite to the substrate 1.

The laminate 10 of the invention functions as a sealing material of the image display element 7.

Hereinafter, members which are used in the invention will be described in detail.

[Substrate]

As the substrate which is used in the invention, a substrate which is usually used in a barrier film or a polarizing plate can be used, and specific examples thereof include glass and a polymer film.

Specific examples of the polymer film include a cellulose acylate film (for example, a cellulose triacetate film, a cellulose diacetate film, a cellulose acetate butyrate film, and a cellulose acetate propionate film); a polyolefin-based resin film such as polyethylene and polypropylene; a polyester-based resin film such as polyethylene terephthalate (PET) and polyethylene naphthalate; a polyethersulfone film; a polyacrylic resin film such as polymethyl methacrylate; a polyurethane-based resin film; a polycarbonate film; a polysulfone film; a polyether film; a polymethyl pentene film; a polyether ketone film; a (meth)acrylonitrile film; a polyimide film, a polyamide film; a polymer film having alicyclic structure (for example, a norbornene-based resin film such as ARTON (manufactured by JSR Corporation)); and an amorphous polyolefin (for example, cycloolefin polymer such as ZEONEX (manufactured by ZEON Corporation)) film.

{Retardation of Substrate}

In the image display device of the invention, outdoor daylight enters the polarizer through the substrate, and thus the retardation of the substrate has no influence. That is, it is not necessary to control the retardation of the substrate.

In many cases, PET has been used as a substrate of a gas barrier film in view of price and the like. However, PET has a large retardation. In a case where a barrier film and a polarizer are separately used, the polarized light passing through the polarizer is influenced by the substrate of the barrier film, and thus a target polarization state may not be obtained.

That is, the laminate and the image display device of the invention are preferable because, since the retardation of the substrate has no influence, it is possible to use a substrate having a large retardation such as PET which has been used.

[Inorganic Layer]

The inorganic layer which is used in the invention is not particularly limited, and various known inorganic layers can be used. As the material of the inorganic layer, various known materials can be used as long as these can be used in the inorganic layer of the gas barrier film. Specific examples thereof include inorganic compounds such as metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxide nitride, silicon oxycarbide, and silicon oxide nitride carbide; silicon nitrides such as silicon nitride and silicon nitride carbide; silicon carbides such as silicon carbide; hydrides of these materials; mixtures of two or more types of these materials; and hydrogen-containing materials of these materials.

Particularly, at least one inorganic compound selected from the group consisting of silicon nitride, silicon oxide, silicon oxynitride, and aluminum oxide is preferable due to its high transparency and compactness. Among these, silicon nitride is particularly preferable since it is more compact and has higher transparency.

The method of manufacturing an inorganic layer is not particularly limited, and various known methods can be used.

Among these, it is preferable that an inorganic layer is produced by vapor-depositing an inorganic compound.

{Alignment Controllability of Inorganic Layer}

The inorganic layer used in Embodiment 2-A of the invention has alignment controllability.

In this specification, the expression "has alignment controllability" means that an organic dichroic pigment can be aligned on the inorganic layer. The alignment state of the organic dichroic pigment is not particularly limited, and includes various known alignment states such as horizontal alignment.

An absorption axis and a transmission axis may appear in the organic layer according to the alignment direction of the organic dichroic pigment. In order to control the directions of the absorption axis and the transmission axis, the inorganic layer which is used in the invention may be produced by oblique vapor deposition.

Various known methods can be used as the oblique vapor deposition method.

{Thickness of Inorganic Layer}

The thickness of the inorganic layer which is used in the invention is not particularly limited. The thickness is preferably 10 nm or greater from the viewpoint of the gas barrier property. In addition, the thickness is preferably 200 nm or less from the viewpoint of breaking and cracks.

[Organic Layer]

The organic layer which is used in the invention is not particularly limited as long as it is an organic layer containing an organic dichroic pigment. The organic dichroic pigment which is used in the invention is not particularly limited, and various known organic dichroic pigments can be used in accordance with target optical characteristics. In this specification, the expression contains an organic dichroic pigment includes not only a low-molecular-weight state before polymerization, but also a polymerized and cured state.

The organic layer which is used in the invention preferably functions as a polarizer.

The method of producing the layer containing an organic dichroic pigment which is used in the invention is not particularly limited. For example, the layer can be produced by coating the inorganic layer with a composition containing an organic dichroic pigment, an alignment agent, a leveling agent, other additives, and a solvent.

A silane coupling agent and the like are preferably used from the viewpoint of improvement in adhesiveness in a case where the organic layer is formed on the inorganic layer as used in Embodiment 2-A of the invention.

As the silane coupling agent, silane coupling agents which have been known can be used without particular limitations. Examples thereof include epoxy group-containing silane coupling agents such as γ-glycidoxypropyltrimethoxysilane, γ-glycidoxypropyltriethoxysilane, γ-glycidoxypropylmethyldiethoxysilane, 2-(3,4-epoxycyclohexyl)ethyltrimethoxysilane, amino group-containing silane coupling agents such as 3-aminopropyltrimethoxysilane, N-2-(aminoethyl)-3-aminopropylmethyldimethoxysilane, and 3-triethoxysilyl-N-(1,3-dimethylbutylidene)propylamine, (meth)acrylic group-containing silane coupling agents such as 3-acryloxypropyltrimethoxysilane and 3-methacryloxypropyltriethoxysilane, and isocyanate group-containing silane coupling agents such as 3-isocyanatepropyltriethoxysilane.

{Organic Dichroic Pigment}

The organic dichroic pigment which is used in the invention is an organic compound exhibiting dichroism. In addition, the organic dichroic pigment preferably exhibits liquid crystallinity from the viewpoint of easy alignment in a case where the organic layer is used as a polarizer. Furthermore, the organic dichroic pigment is preferably a thermotropic liquid crystal dichroic pigment having excellent heat resistance so as to withstand high temperatures during the formation of the inorganic layer.

As the thermotropic liquid crystal dichroic pigment which is used in the invention, for example, thermotropic liquid crystal dichroic pigments described in JP2011-237513A can be suitably used.

{Thickness of Organic Layer}

The thickness of the organic layer which is used in the invention is not particularly limited. The thickness is preferably 50 nm to 2000 nm in view of the balance between a desired retardation and the performance of the organic layer as a gas barrier film.

{Glass Transition Temperature of Organic Layer}

The glass transition temperature of the organic layer which is used in the invention is not particularly limited. The glass transition temperature is preferably 120° C. or higher for withstanding high temperatures during vapor deposition in a case where the inorganic layer is vapor-deposited after the organic layer is formed as in Embodiment 2-B of the invention.

[Alignment Film]

In a form in which the inorganic layer is not used as an alignment film in producing the organic layer of the invention, an alignment film may be separately used. As the alignment film, various known alignment films can be sued, and specifically, an alignment film obtained by rubbing polyvinyl alcohol (PVA), a photo-alignment film, or the like can be appropriately selected in accordance with a target alignment state of the organic dichroic pigment.

In a case where the inorganic layer is produced after the alignment film is disposed, an azo- or cinnamoyl-based photo-alignment film having excellent heat resistance is preferably used.

Various known azo- or cinnamoyl-based photo-alignment films can be used.

The photo-alignment film is not particularly limited. Polymer materials of polyamide compounds and polyimide compounds described in paragraphs [0024] to [0043] of WO2005/096041A; liquid crystal alignment films formed using a liquid crystal alignment agent having a photo-aligned group described in JP2012-155308A; LPP-JP265CP (product name) manufactured by Rolic technologies; and the like can be used.

[Optical Anisotropic Layer]

The laminate of the invention may further include art optical anisotropic layer.

The optical anisotropic layer which is used in the invention may have an in-plane retardation. In addition, the optical anisotropic layer preferably has a λ/4 plate function to convert linearly polarized light into circularly polarized light. The optical anisotropic layer which is used in the invention may be a single layer having a λ/4 plate function, or composed of a plurality of layers such that the whole layers have a λ/4 plate function.

The method of placing the plurality of layers of the optical anisotropic layer which is used in the invention is not particularly limited. Examples thereof include a method of bonding layers produced separately to each other with an adhesive, and a method of directly coating a produced layer with another layer.

{Material of Optical Anisotropic Layer}

The material of the optical anisotropic layer which is used in the invention is not particularly limited, and a polymer film or a layer formed from a liquid crystal compound may be used. A layer formed from a liquid crystal compound is preferably used from the viewpoint that the thickness of the optical anisotropic layer can be reduced.

<Liquid Crystal Compound>

The liquid crystal compound which is used in the invention is not particularly limited, and various known liquid crystal compounds can be used in accordance with target optical characteristics.

The method of producing a layer formed from a liquid crystal compound is not particularly limited. For example, the layer can be produced by forming an alignment film on a support and by then applying a composition containing a liquid crystal compound, an alignment agent, a leveling agent, other additives, and a solvent.

The optical anisotropic layer which is used in the invention preferably has reciprocal wavelength dispersibility such that the in-plane retardation increases with wavelength.

The optical anisotropic layer which is used in the invention may have a plurality of layers in order to adjust optical characteristics. In that case, the whole optical anisotropic layer may have a λ/4 plate function.

Examples of the combination of the plurality of layers include a combination of a positive-A plate and a positive-C place and a combination of a λ/4 plate and a λ/2 plate.

[Image Display Element]

The image display element which is used in the invention is not particularly limited, and a liquid crystal display element, an EL display element such as an organic EL or an inorganic EL, or the like can be used.

Specifically, the image display device of the invention can be obtained by using the laminate of the invention in place of a glass substrate or a cell substrate on the light extraction side which is usually used.

EXPLANATION OF REFERENCES

1: substrate
2: inorganic layer
3: organic layer
4: image display element
10: laminate
11: image display device

What is claimed is:

1. A laminate comprising,
   a substrate, an inorganic layer, and an organic layer,
   wherein the laminate does not further comprise a liquid crystal layer,
   wherein the organic layer contains an organic dichroic pigment, and
   wherein the substrate, the organic layer, and the inorganic layer are provided in this order.

2. An image display device comprising, in the following order from a visible side:
   a substrate;
   an inorganic layer;
   an organic layer, and
   an image display element,
   wherein the organic layer contains an organic dichroic pigment.

3. The image display device according to claim 2,
   wherein the image display element is an electroluminescence display element.

4. The image display device according to claim 3,
   wherein the electroluminescence display element is an organic electroluminescence display element.

5. The image display device according to claim 2,
   wherein the image display element is a liquid crystal display element.

* * * * *